(12) United States Patent
Okubora

(10) Patent No.: US 6,504,096 B2
(45) Date of Patent: *Jan. 7, 2003

(54) SEMICONDUCTOR DEVICE, METHODS OF PRODUCTION OF THE SAME, AND METHOD OF MOUNTING A COMPONENT

(75) Inventor: Akihiko Okubora, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/404,478

(22) Filed: Sep. 24, 1999

(65) Prior Publication Data

US 2002/0074146 A1 Jun. 20, 2002

(30) Foreign Application Priority Data

Sep. 29, 1998 (JP) .......................... 10-275925

(51) Int. Cl.[7] ............................... H01L 23/34
(52) U.S. Cl. ..................... 174/52.2; 257/704; 257/707; 257/712; 257/713
(58) Field of Search .............. 174/52.1, 52.2; 361/688, 704, 709, 710, 711, 712, 717, 718, 719, 722; 257/704, 706, 707, 712, 713, 717, 718, 719

(56) References Cited

U.S. PATENT DOCUMENTS

| | | | | |
|---|---|---|---|---|
| 4,285,002 A | * | 8/1981 | Campbell | 357/74 |
| 5,227,663 A | * | 7/1993 | Patil et al. | 257/718 |
| 5,404,273 A | * | 4/1995 | Akagawa | 361/707 |
| 5,486,720 A | * | 1/1996 | Kierse | 257/659 |
| 5,633,533 A | * | 5/1997 | Andros et al. | 257/707 |
| 5,724,230 A | * | 3/1998 | Poetzinger | 361/758 |
| 5,909,056 A | * | 6/1999 | Mertol | 257/704 |
| 6,008,536 A | * | 12/1999 | Mertol | 257/704 |

* cited by examiner

Primary Examiner—Dean A. Reichard
Assistant Examiner—Carmelo Oliva
(74) Attorney, Agent, or Firm—Sonnenschein, Nath & Rosenthal

(57) ABSTRACT

A semiconductor device including a package board having interconnection patterns on one main surface, a semiconductor chip electrically connected through internal terminations to the interconnection patterns of the package board and having an element forming surface facing the package board across a space, and a conductive plate connected to a back surface of the semiconductor chip of a side opposite to the element forming surface through a conductive bonding layer, the semiconductor chip being sealed in a resin formed in a circumferential direction in the space between the package board and the conductive plate, one main surface of the package board being provided with a depression enlarging the space in the thickness direction of the package board.

6 Claims, 18 Drawing Sheets

SEMICONDUCTOR DEVICE, METHODS OF PRODUCTION OF THE SAME, AND METHOD OF MOUNTING A COMPONENT

RELATED APPLICATION DATA

The present application claims priority to Japanese Application No. P10-275925 filed Sep. 29, 1998 which application is incorporated herein by reference to the extent permitted by law.

BACKGROUND OF THE INVENTION

1. Field of the Invention

The present invention relates to a packaged semiconductor device comprised of a semiconductor chip mounted while preventing a reduction of characteristics and to a method of production of the same.

Further, the present invention relates to a method for mounting a semiconductor chip or filter chip or other component on a substrate, more particularly relates to a method of mounting preferred for mounting a semiconductor chip or component for high speed, high frequency applications.

2. Description of the Related Art

In recent years, advances in cellular telephones, integrated service digital networks (ISDNs), personal computers (PC), and other information communication (network) technologies have led to attempts to mount high frequency communication blocks, high speed serial interfaces, etc. in a variety of apparatuses.

When mounting such a high speed, high frequency circuit block in an apparatus, it is necessary to assemble this circuit block at low cost and compactly. In addition, a method of mounting taking in account high speed operation, reduction of noise, etc. has been demanded.

Due to such demands, attention has been paid to multichip modules, (MCM) flip-chip mounting, and other bare chip mounting technologies as methods for mounting semiconductor chips.

In flip-chip mounting, usually a projecting electrode (bump) is formed on each of the input-output (I/O) pads of the semiconductor chip and the semiconductor chip is turned faced down and connected to a substrate by solder or the like. For this reason, flip-chip mounting has the characteristic features that the wiring paths are formed shorter compared with a case of connection using wire-bonding or the like, a low inductance, a low capacitance, and a low resistance can be realized, operation is high in speed, and the high frequency characteristics are excellent.

FIG. 18 shows an example of the configuration in the case where a semiconductor chip is mounted on a mother board by the flip-chip technology.

In order to achieve this mounting structure 100, high melting point solder bumps 104 are formed in advance on the I/O pads of the semiconductor chip 102. Further, solder 108 is precoated at predetermined positions on interconnection patterns 106a on the mother board 106.

In this state, the semiconductor chip 102 is turned face down and positioned onto the mother board 106. The two are then connected by applying heat and pressure.

Next, a connection portion of the semiconductor chip 102 and the mother board 106 is filled with a resin 110 so as to relieve the thermal stress applied to the soldered portions, to protect the surface of the semiconductor chip 104, or due to other demands for reliability.

Summarizing the problems to be solved by the invention, in this flip-chip connection method, however, the interconnections on the semiconductor chip 102 are further covered by an organic substance (resin 110) other than a protective layer 102a at the surface. As a result, an increase of a parasitic capacitance component or other change of impedance occurs.

Particularly, in the case of microwave monolithic integrated circuits (MMIC), some high speed digital ICs, and the like where the interconnections are formed by microstrip lines, coplanar lines, or the like, this change in the impedance detracts from the impedance matching and other optimum design conditions and results in the various characteristics being lowered from their design values.

Further, changes occur in the constants of spiral inductors or other passive elements and, in addition, the characteristics are degraded due to a dielectric loss.

Further, the addition of the organic substance on to the top part of field effect transistors (FET) causes an increase of a gate capacitance and becomes a cause of a reduction of the noise factor.

This change in impedance causes serious changes in the characteristics in surface acoustic wave (SAW) filters and other filters based on a vibration mode of a surface acoustic wave.

On the other hand, particularly in the case of a high frequency semiconductor circuit, usually it is necessary to metalize the back of the semiconductor chip 102 and to sufficiently stably ground this back surface metal. This is because, in for example MMICs, the interconnections are frequently formed by using microstrip lines or coplanar (grounded coplanar) lines.

In the flip-chip mounting structure as shown in FIG. 18, however, there is the disadvantage that the back surface metal cannot be sufficiently stably reduced to the ground potential.

Further, particularly in ICs comprised of high power circuits etc., the heat generation is also large. It many cases, a structure where the chip back surface is connected to the mother board via a conductive layer by die bonding as in the related art becomes necessary.

In the flip-chip mounting structure shown in FIG. 18, however, when mounting an IC having high power circuits, air cooling from the chip back side alone is not sufficient for dissipation of the heat. As a result, there is a strong apprehension of a reduction of the output power of the IC or other reductions in characteristics.

For this reason, in particular for mounting a semiconductor chip for high speed, high frequency applications or where a high output power is required, the conventional mounting method, that is, the method of die-bonding the semiconductor chip with its element forming surface facing upward, connecting the terminals by wire bonding, then performing a complex sealing step in a nitrogen atmosphere for accommodating the chip in a hollow package, has been adopted.

Accordingly, due to the complicated process, the need for expensive and large size packages of ceramic and metal, and the high cost of this mounting method, a small size and low cost mounting method for high speed, high frequency applications or high power usages has been strongly demanded.

SUMMARY OF THE INVENTION

An object of the present invention is to provide a packaged semiconductor device having high characteristics and reliability and low cost.

Another object of the present invention is to provide a method of mounting a semiconductor chip or other component which enables a small parasitic inductance etc. and facilitates heat dissipation and ground while using flip-chip mounting and which results in excellent characteristics and reliability and low cost.

According to a first aspect of the present invention, there is provided a semiconductor device comprising a package board having interconnection patterns on one main surface, a semiconductor chip electrically connected through internal terminations to interconnection patterns of the package board and having an element forming surface facing the package board across a space, and a conductive plate connected to a back surface of the semiconductor chip of a side opposite to the element forming surface through a conductive bonding layer, the semiconductor chip being sealed in a resin formed in a circumferential direction in the space between the package board and the conductive plate.

Preferably, the one main surface of the package board is provided with a depression enlarging the space in the thickness direction of the package board.

Preferably, the device further comprises external terminations formed on the other main surface of the package board and electrically connected to corresponding interconnection patterns and connectors formed in the resin and electrically connecting the conductive plate to the interconnection patterns electrically connected to external terminations for supply of a reference potential.

More preferably, the element forming surface of the semiconductor chip is formed with a circuit, electrode pads for an input signal or an output signal of the circuit are provided at opposite two sides among the four sides of the semiconductor chip, and the connectors are arranged at the outside of the other two sides of the semiconductor chip.

Preferably, the other main surface of the package board is formed with external terminations electrically connected to corresponding interconnection patterns, the element forming surface of the semiconductor chip is formed with a circuit, and external terminations for an input signal or an output signal are arranged below electrode pads for an input signal or output signal of the circuit.

Preferably, the resin is mainly comprised of an epoxy-based resin, an acryl-based resin, or an acid anhydride-based resin alone or in mixtures of two or more types, is formed into a gel or paste by addition of a curing agent, and is shrunken by a heat reaction.

According to a second aspect of the present invention, there is provided a method of production of a semiconductor device comprising a step of forming a package board having interconnection patterns on one main surface, a step of forming internal terminations on an element forming surface of a wafer for forming a semiconductor chip or the interconnection patterns, a step of securing the semiconductor chip to the package board so as to make it be electrically connected through the internal terminations to the interconnection patterns and so that the element forming surface faces the package board across a space, a step of making a conductive plate be connected to a back surface of the semiconductor chip through a conductive bonding layer, and a step of securing the package board and the conductive plate at a peripheral part of the semiconductor chip by a resin so that the space is maintained at the element forming surface side of the semiconductor chip.

Preferably, the step of forming the package board includes a step of forming a depression enlarging the space in the thickness direction of the package board at a location where one main surface of the package board will face the element forming surface of the semiconductor chip.

Preferably, the method further comprises a step of forming on the other main surface of the package board external terminations for electrical connection with corresponding interconnection patterns and a step of forming connectors on the interconnection patterns electrically connected to external terminations for supply of a reference potential, the conductive plate contacting and being electrically connected to the connectors in the step of connection of the conductive plate, the resin being supplied around the connectors in the step of securing by the resin.

Preferably, the step of connection of the conductive plate includes a step of supplying a conductive bonding layer to a predetermined position of a back of the semiconductor chip, a step of positioning a conductive plate on the back of the semiconductor chip and mounting it while applying pressure and heat, and a step of cooling while maintaining the pressure at the time of applying the above pressure as it is.

Preferably, the resin includes dispersed therein ceramic particles.

According to a third aspect of the present invention, there is provided a method of production of a semiconductor device comprising a step of forming a package board having interconnection patterns on one main surface, a step of forming internal terminations on an element forming surface of a wafer for forming a semiconductor chip or the interconnection patterns, a step of securing a semiconductor chip on a conductive plate so that the back surface at a side opposite to the element forming surface is electrically connected through a conductive bonding layer, a step of supplying a resin around a chip securing location of the package board, and a step of securing the conductive plate to which the semiconductor chip is secured to the package board so that the semiconductor chip is electrically connected through the internal terminations to the interconnection patterns, the element forming surface of the semiconductor chip faces the package board across a space, and the semiconductor chip is sealed by the resin.

Preferably, the method further comprises a step of forming bumps on electrode pads of the semiconductor chip as the internal terminations, wherein the step of securing the conductive plate comprises a step of supplying a conductive layer on to the interconnection patterns, a step of positioning so that the bumps come over the conductive layer and mounting the conductive plate to which the semiconductor chip is secured on to the package board while applying pressure and heat, and a step of cooling while maintaining the pressure at the time of applying the above pressure as it is.

Preferably, the method further comprises a step of forming on the other main surface of the package board external terminations for electrical connection to the corresponding interconnection patterns and a step of placing connectors on the resin, in the step of securing the conductive plate, the connectors being buried in the resin in a state of electrical connection between the interconnection patterns electrically connected to an external connection for supply of a reference potential and the conductive plate.

Preferably, the resin is processed into a tape form for supply on the package board.

Preferably, the resin contains dispersed therein conductive particles.

Preferably, the conductive particles are comprised of metal balls or of plastic balls coated with a metal.

According to a fourth aspect of the present invention, there is provided a method of mounting a component for face-down mounting of a component formed with elements on its surface from an element forming surface to a mounting board, the method of mounting a component comprising a step of forming a depression at a location of the mounting board, having interconnection patterns at one main surface, where the component is to be mounted and a step of bringing the element forming surface into alignment with the location where the depression was formed and securing the component to the mounting board.

Preferably, the method further comprises a step of securing a conductive plate to a surface of the component at a side opposite to the element forming surface while electrically connecting it to interconnection patterns of the mounting board for supply of a reference potential.

In the semiconductor device according to the present invention and the methods of production of the same or the method of mounting a component according to the present invention, the semiconductor chip, surface elastic filter, or other component is mounted face-down onto a mounting board or package board across a space. Accordingly, the resin or other organic substance does not contact the element-forming surface of the component in the mounting step and therefore the impedance etc. of the component does not change from the design values.

Further, particularly, in the semiconductor device, since corresponding external terminations are provided below signal input use or signal output use electrode pads of the semiconductor chip, the distance from the semiconductor chip to the external terminations can be made shortest.

Further, since one direction of the component (back surface in the case of a semiconductor chip) is electrically connected to the board via a conductive plate, a grounding route and a heat dissipation route by a conductive material are reliably secured.

Due to the above, mounting becomes possible while keeping reduction of the characteristics of the components as low as possible.

Particularly, in the semiconductor device, since the resin is formed at the peripheral part of the sides so as not to cause a reduction of the characteristics of the semiconductor chip and the semiconductor chip is sealed by the resin, the hermeticity is high and intrusion of moisture and contaminants from the outside is effectively prevented.

Among the methods of production of the semiconductor device, in the method supplying the resin before connecting the semiconductor chip to the package board, the connectors for connecting the conductive plate to the interconnection patterns for the supply of the common potential of the package board are embedded after the supply of the resin, but if conductive particles are contained in the resin, conductivity will be manifested by application of pressure. Therefore, electrical connection of the two is achieved due to the application of pressure when embedding the connectors in the resin even if the connectors do not contact the interconnection patterns.

BRIEF DESCRIPTION OF THE DRAWINGS

These and other objects and features of the present invention will become further clear from the following description of the preferred embodiments given with reference to the attached drawings, in which.

DESCRIPTION OF THE PREFERRED EMBODIMENTS

First Embodiment

An embodiment of the method of mounting according to the present invention will be explained by taking as an example a case of mounting a semiconductor chip as a component on a board.

First, an explanation will be made of the mounting structure of the semiconductor chip formed by the present mounting method.

Figure 1:
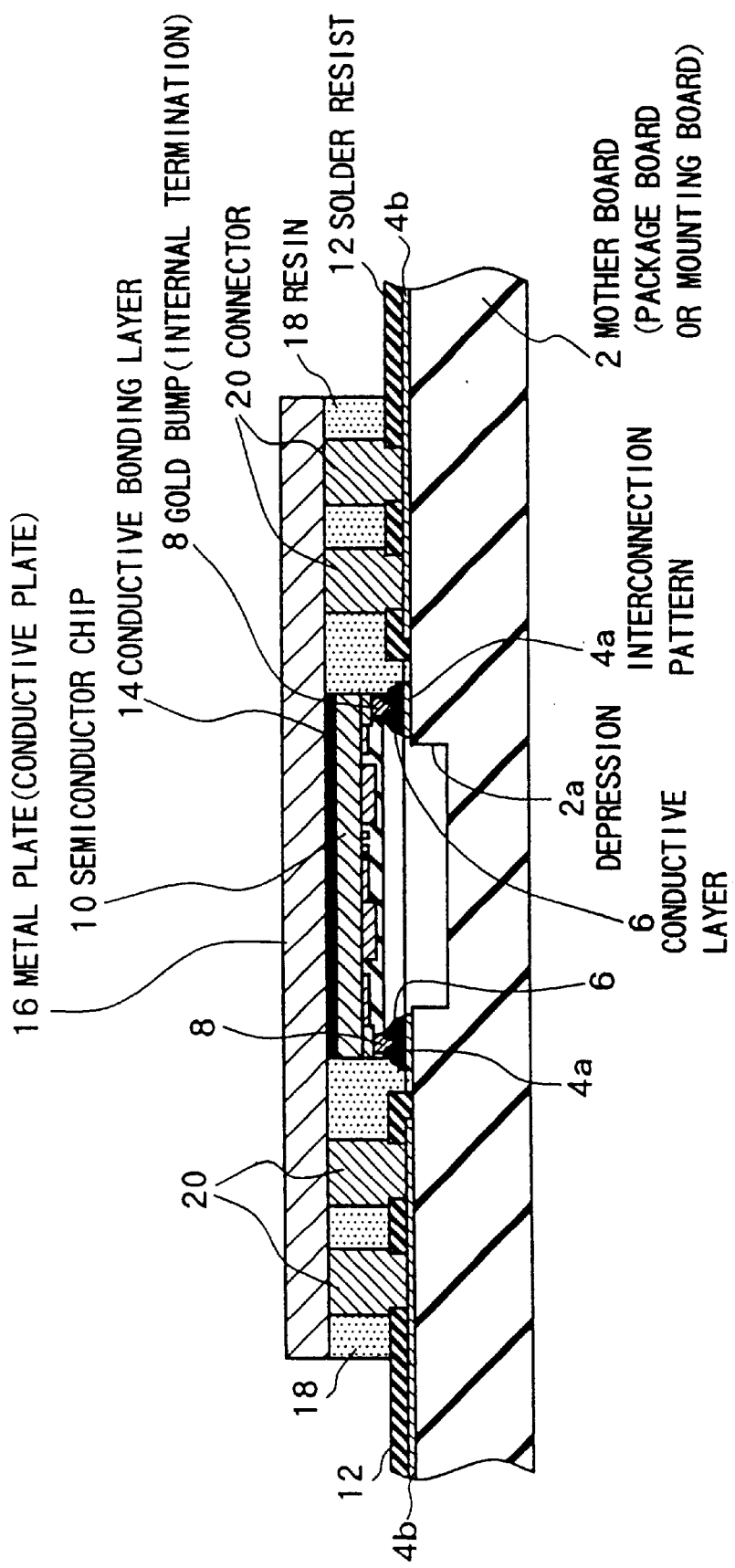
FIG. 1 is a sectional view of a mounting structure of a semiconductor chip according to a first embodiment of the present invention.

FIG. 1 is a sectional view of an example of mounting a semiconductor chip onto a board.

In the example shown in FIG. 1, a depression 2a is formed in a mother board 2 serving as the package board or the mounting board.

The material of this mother board 2 is not limited. As representative mother boards 2, there are printed circuit boards and other organic boards, alumina or mullite or other ceramic substrates, silicon substrates with a polyimide tape on one surface, etc.

The board 2 may be a single layer or a multi-layer board. In the case of a multi-layer structure, the depression 2a is formed by adhering a layer having an opening at the surface-most portion.

Interconnection patterns 4a and 4b made of copper or another metal are formed on the surface of the board 2 at which the depression 2a is formed by a pattern etching, metal foil bonding, etc.

The semiconductor chip 10 is fixed on the interconnection patterns 4a formed at the periphery of the depression 2a via conductive layers 6 of for example silver paste and gold bumps 8 serving as internal terminations. The semiconductor chip 10 is positioned with its element forming surface close to the depression 2a of the mother board 2 and fixed with the element forming surface downward with a space from the mother board 2.

The interconnection patterns at locations other than those to which the semiconductor chip 10 is fixed are coated by a solder resist 12. The solder resist 12 is opened at predetermined locations on the interconnection patterns 4b for supply of the reference voltage.

Figure 2:
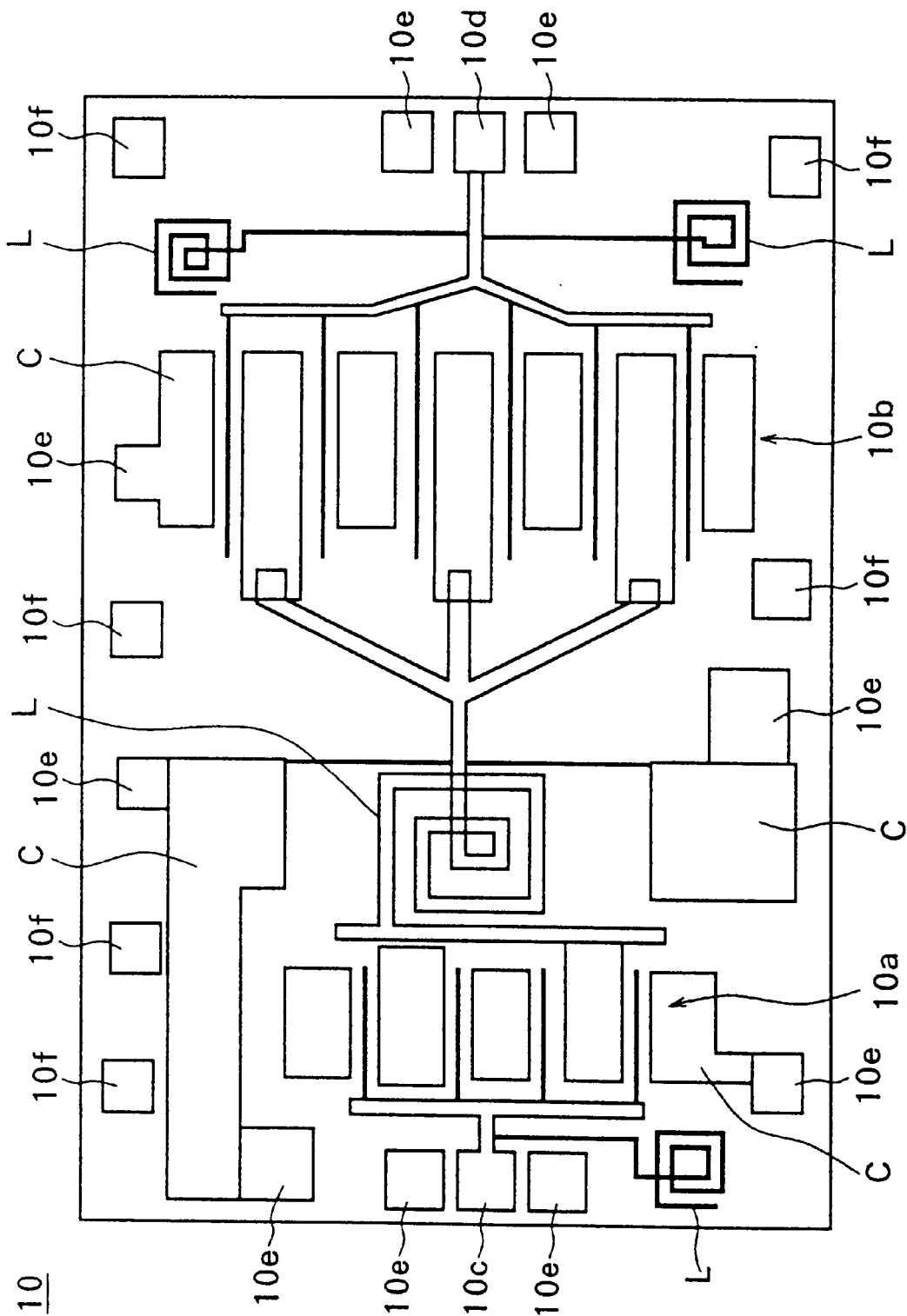
FIG. 2 is a schematic plan view of an MMIC as an example of a semiconductor chip.

FIG. 2 is a schematic plan view of an MMIC as an example of this semiconductor chip. Further, FIG. 3 is a schematic sectional view of the structure of an MMIC.

The MMIC of this illustrated example is a power amplifier using a microstrip line type interconnection structure and has a first stage FET amplification unit 10a, a second stage FET amplification unit 10b, and a plurality of inductors L and capacitors C provided between the stages or between a signal line and electrode pad for supplying the common potential. An electrode pad 10c for the input signal is arranged at one side of the MMIC, while an electrode pad 10d for the output signal is arranged at the side opposite to this. Electrode pads 10e for supplying the common potential are arranged at the two sides of these signal use electrode pads 10c and 10d. Further, electrode pads 10e for supplying the common potential and electrode pads 10f for supplying a power supply voltage or control signal are arranged at the other two sides.

Figure 3:
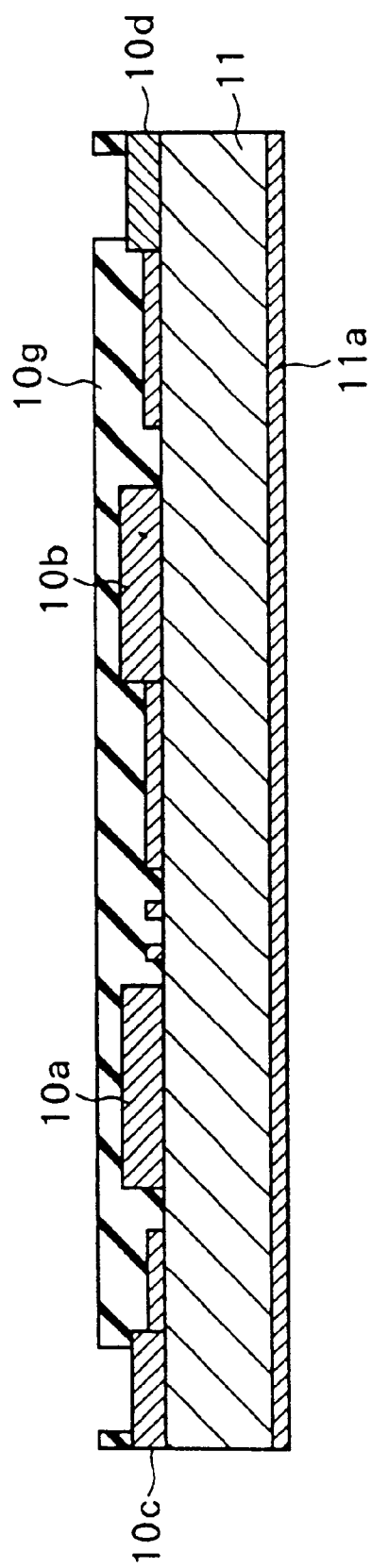
FIG. 3 is a schematic sectional structural view of the MMIC.

These elements and electrode pads are formed on for example a semi-insulating semiconductor substrate 11 directly or via an insulating film as shown in the sectional view of FIG. 3. The element forming surface on which the elements are formed is covered by an overcoat film 10g. The overcoat film 10g is opened above the electrode pads.

As a contact layer for fixing the semiconductor substrate at a reference potential, a back surface metal layer 11a made of for example gold is formed on the back surface opposite to the element forming surface.

As shown in FIG. 1, a metal plate 16 is placed as a conductive plate on the back surface metal layer 11a of the semiconductor chip 10 constituted in this way via a silver paste or other conductive bonding layer 14. The metal plate 16 is comprised of for example copper, stainless steel, aluminum, or another metal or an alloy containing that metal or AlN, alumina, a glass ceramic, etc. having a metal film patterned on the surface. A material excellent in heat conductivity is preferred.

A resin 18 is filled at a peripheral part of the semiconductor chip 10 in the space between the facing metal plate 16 and mother board 2. The resin 18 is preferably mainly comprised of an epoxy-based, acryl-based, or acid anhydride-based resin alone or in a mixture, is prepared in the form of a gel or paste by addition of a curing agent, and is shrunk by a heating reaction.

Ceramic particles are dispersed in this resin 18. Usually, a glass transition point Tg of the resin is a low 100° C. to 140° C. Further, a thermal expansion coefficient of the resin is a high 70 ppm to 150 ppm compared with the 3.5 ppm of silicon. If ceramic particles referred to as a "filler" are dispersed in the resin so as to ensure the reliability at the time of high temperature humidification at the time of bonding, the thermal expansion coefficient of the resin can be lowered and the heat resistance and humidity resistance can be improved.

This resin 18 does not penetrate to the element forming surface of the semiconductor chip 10, so the space between the semiconductor chip 10 and the mother board 2 can be maintained as it is.

Conductive connectors 20 for electrically connecting the interconnection patterns 4b for supply of the reference potential and the metal plate 16 are embedded in the resin 18 at locations of the openings of the solder resist 12. The connectors 20 are made of for example a solder paste.

Next, an explanation will be made of the method of mounting a component (semiconductor chip) by referring to the drawings.

First, the gold bumps 8 are formed. Note that it is also possible to form the gold bumps 8 on the mother board 2 side, that is, on the interconnection patterns 4a, but here a description will be made of the simple method of forming the gold bumps 8 on the wafer in advance during the semiconductor manufacturing process.

Figure 4:
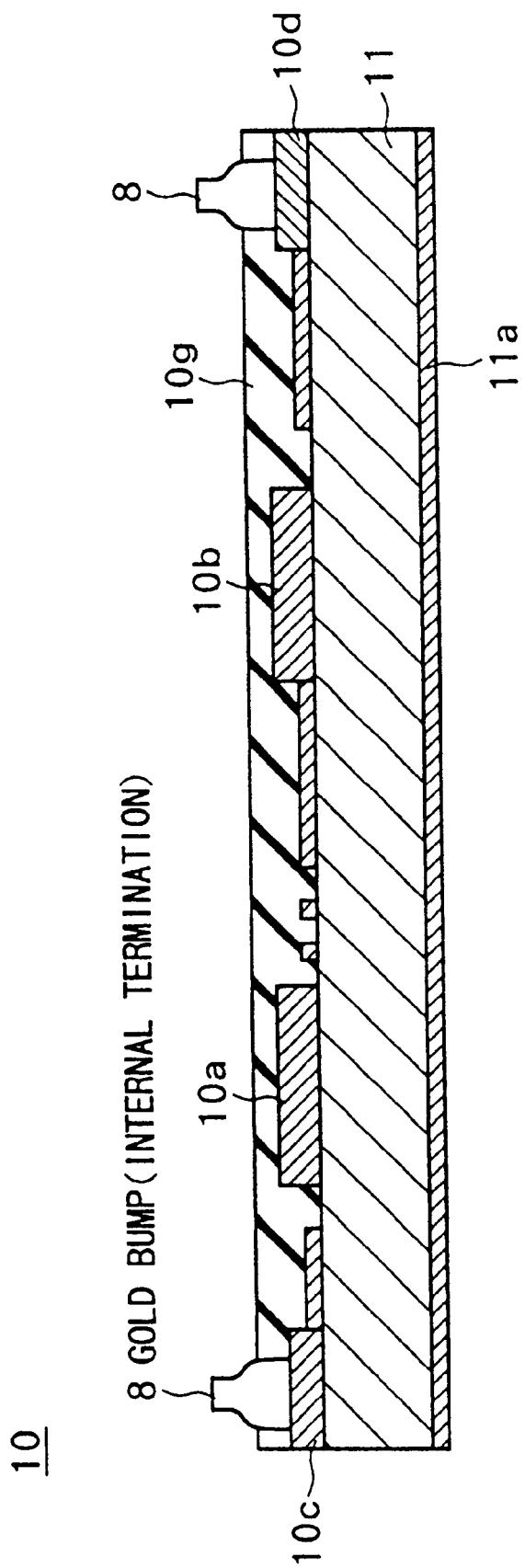
FIG. 4 is a sectional view of a single chip part of a wafer on which gold bumps are formed.

FIG. 4 is a sectional view of a single chip part of a wafer on which gold bumps are formed. Further, FIGS. 5A to 5D are views sequentially showing a gold bump forming step using the wire-bonding method.

Figure 5:
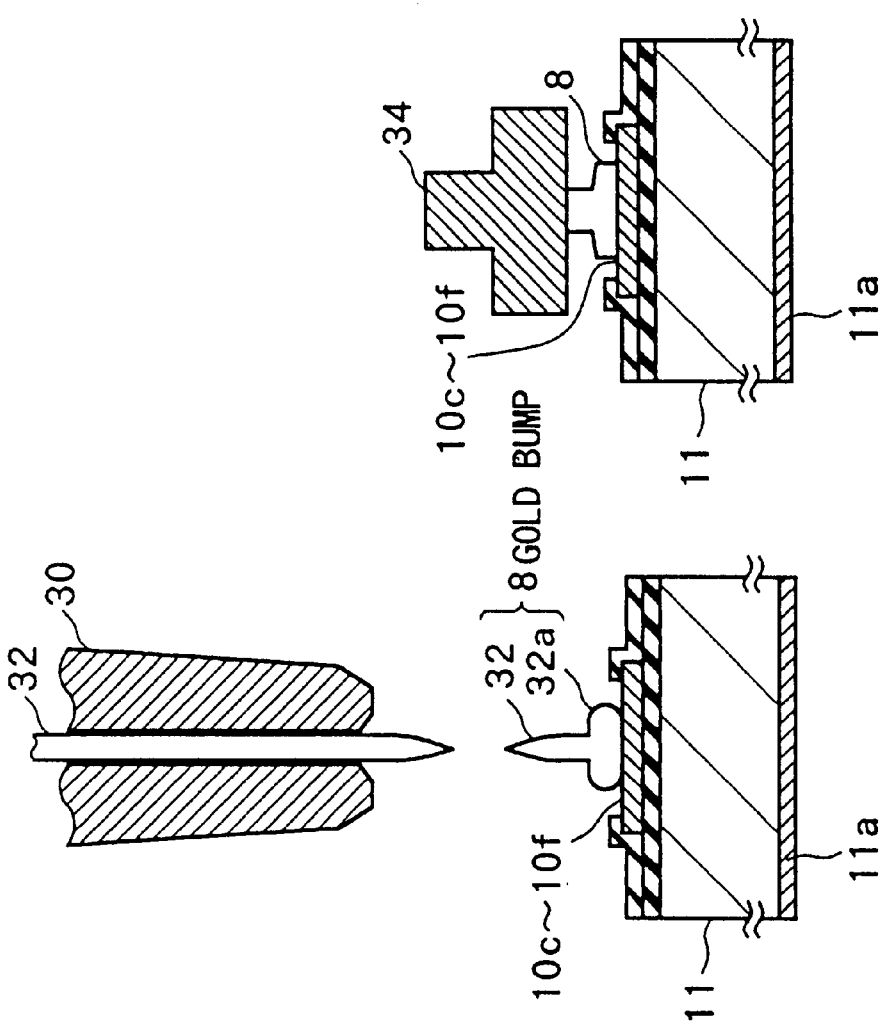
FIGS. 5A to 5D are views of a gold bump forming step by a wire-bonding method.

Reference numeral 30 in FIG. 5A shows a capillary in a usual wire bonder. A gold wire 32 is passed through this capillary 30. A gold ball 32a is formed at the tip by melting by electrical discharge.

The gold ball 32a is pressed against the top of the electrode pad (10c to 10f) by the capillary 30, the gold ball 32a is crushed, and the gold ball 32a and the electrode pad surface are bonded by thermocompression bonding or high frequency thermocompression bonding (FIG. 5B). When the gold wire 32 is pulled up by the capillary 30, the gold wire 32 breaks off at its root (FIG. 5C). After the gold bumps are sequentially formed on required electrode pads 10c to 10f, a stamper 34 or other predetermined tool (FIG. 5D) is used to shape the broken parts of the gold wire 32 (gold bumps 8) to standardize their heights.

Thereafter, the semiconductor chip 10 is cut out from the wafer by dicing.

Figure 6:
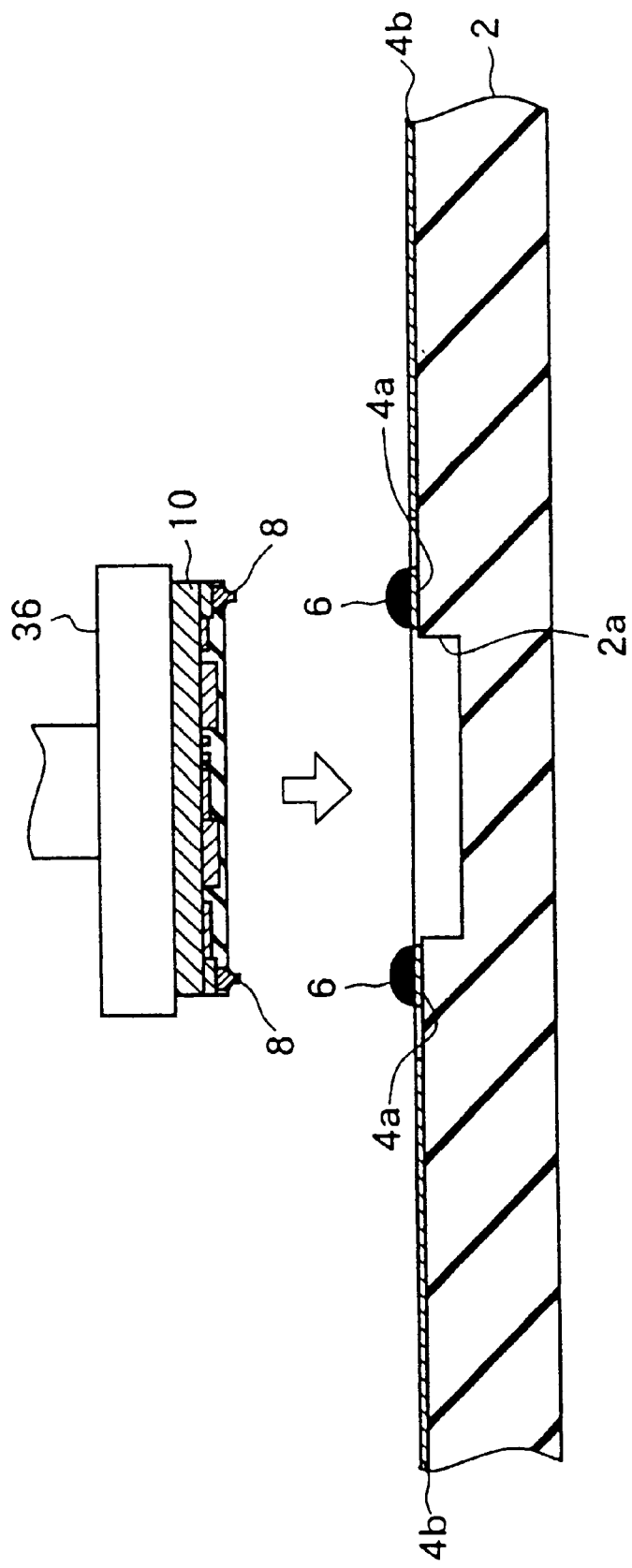
FIG. 6 is a sectional view of a process of mounting a semiconductor chip according to the first embodiment of the present invention and shows a time of mounting the semiconductor chip.
Figure 7:
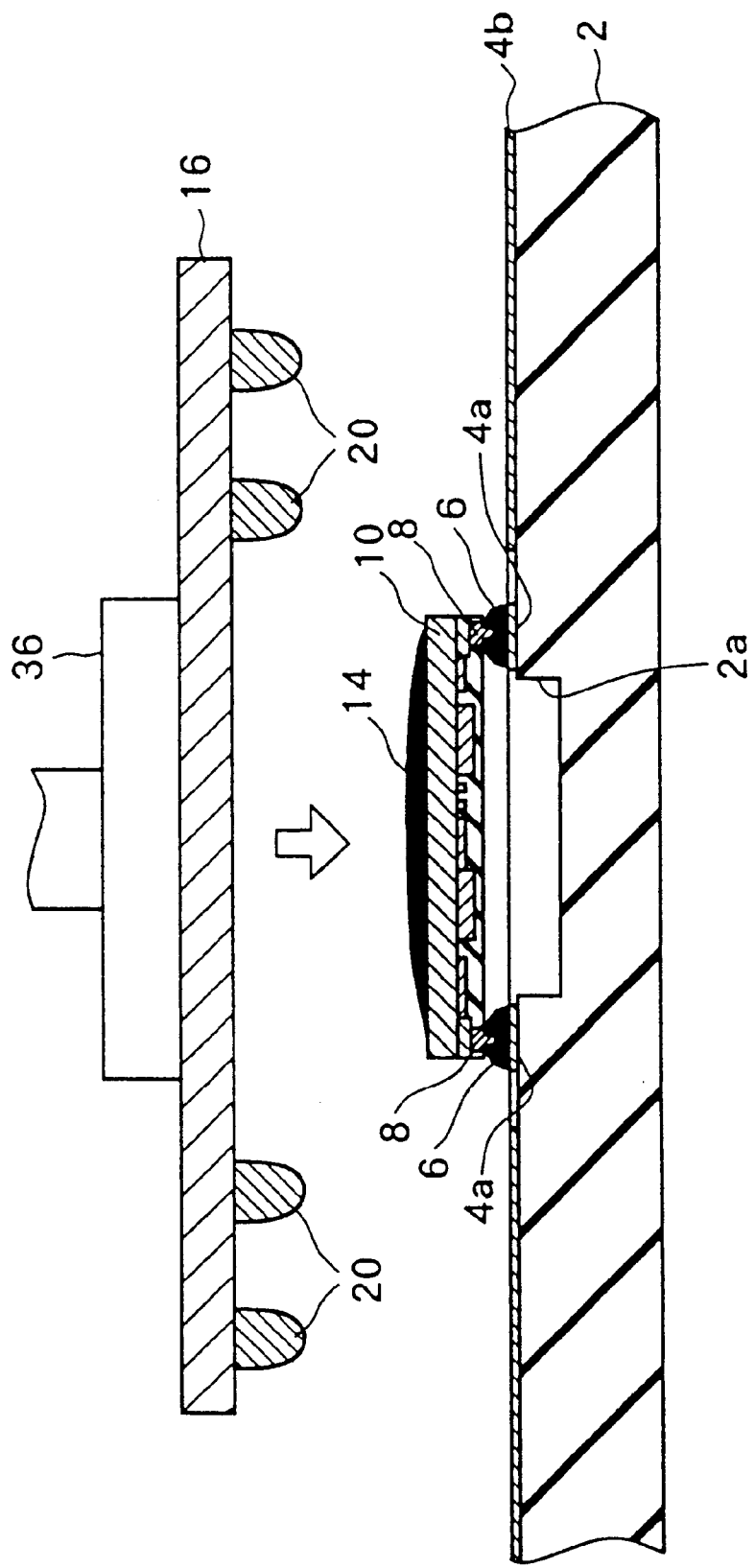
FIG. 7 is a sectional view of the process of mounting the semiconductor chip continuing from FIG. 6 and shows the time of mounting a conductive plate.
Figure 8:
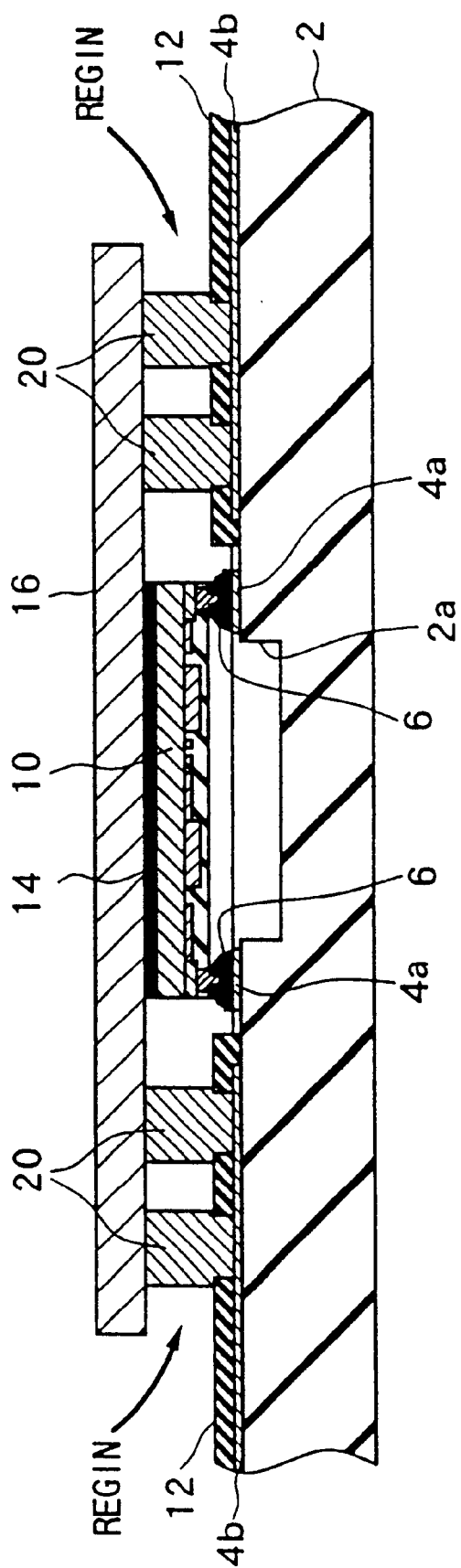
FIG. 8 is a sectional view of the process of mounting the semiconductor chip continuing from FIG. 7 and shows the time before injection of the resin.

FIG. 6 to FIG. 8 are sectional views showing the mounting process of a semiconductor chip.

As shown in FIG. 6, a for example ceramic multilayer mother board 2 provided with an illustrated depression 2a at a chip mounting part is prepared. A for example tin paste is coated as a conductive layer 6 on the predetermined interconnection patterns 4a at the periphery of the depression 2a.

The semiconductor chip 10 provided with the gold bumps is held and positioned by a mounting tool 36 with the element forming surface facing down. The semiconductor chip 10 is then mounted on the mother board 2 while heating it at for example about 240° C. to 280° C.

By this, as shown in FIG. 7, the semiconductor chip 10 is fixed with a space between its element forming surface and the mother board 2.

A metal plate 16 is prepared. Solder paste for forming the connectors 20 is supplied to predetermined positions of one surface thereof, for example, the patterned parts. Further, for example, silver paste is coated in a predetermined amount as the conductive bonding layer 14 on the back surface of the semiconductor chip 10.

The metal plate 16 is held and positioned by the mounting tool 36 with the surface on which the solder paste is formed facing downward. The metal plate 16 is press-bonded to the back surface of the semiconductor chip 10 while heating it at for example about 180° C. to 240° C.

By this, as shown in FIG. 8, the metal plate 16 is fixed to the back surface of the semiconductor chip 10. Further, the connectors 20 for electrically and mechanically connecting the surfaces of the interconnection patterns 4b opened in the solder resist for supply of the common potential and the metal plate 16 are formed in the space between the facing metal plate 16 and mother board 2.

In this state, in the space with the metal plate, a resin 18 is injected from the periphery into the space between the metal plate 16 and the mother board 2 by utilizing its surface tension. At this time, the viscosity and the temperature of the resin is controlled, as shown in FIG. 1, so that the resin 18 is injected up to a degree where it reaches the side surfaces of the semiconductor chip 10 before the depression 2a of the mother board. Due to this, the semiconductor chip 10 can be sealed in the resin 18 and the resin 18 can be prevented from penetrating to the element forming surface side of the semiconductor chip 10.

Note that while a semiconductor chip was mentioned as an example of a component having elements formed on its surface in the above explanation, the component may also be for example a SAW device etc.

Further, the depression 2a is provided in the board 2 to reliably secure the space, but when the space can be sufficiently secured by the height of the internal terminations (gold bumps 8) or the like or when the internal terminations can be built up by conductive spacers etc., it is also possible to omit the formation of the depression 2a. The internal terminations are not limited to the gold bumps 8 and can be for example conductive balls as well.

As the flip-chip procedure for bonding the semiconductor chip 10 onto the mother board 2, in the above example, Au—Sn alloy bonds were used, but it is also possible to use solder flip-chip method using Sn—Pb solder, a procedure using gold bumps and a conductive paste, a method using ultrasonic wave heating and bonding of Au—Au, etc. Similarly, various modifications are possible for the bonding of the metal plate 16 and the semiconductor chip 10 or the mother board 2.

Further, it is also possible to use an electric field plating method as the method for forming the bumps.

In a mounting structure using the method of mounting a component (semiconductor chip) according to the present embodiment, the depression 2a is provided in the mother board 2, and a space is formed between the element forming surface of the semiconductor chip 10 and the mother board 2. Further, the semiconductor chip 10 is sealed at its peripheral part by the resin 18 between the mother board 2 and the metal plate 16, but this resin 18 does not penetrate to the element forming surface of the semiconductor chip 10.

For this reason, there is the advantage that the packaging does not result in a parasitic capacitance being added to a circuit pattern formed by using for example microstrip lines. Further, the intrusion of moisture and the contaminants from the outside is effectively prevented by the resin 18 and therefore a high reliability is secured.

The semiconductor substrate 11 of the semiconductor chip 10 is reliably electrically connected to the interconnection patterns 4b for the supply of the common potential via the metal plate 16 and the connectors 20. For this reason, there is the advantage that the semiconductor substrate 11 can be stably grounded etc. with a sufficiently low resistance.

In addition, since the top surface of this metal plate 16 is exposed, it sufficiently acts as the heat radiating plate. Therefore, the heat generated at the semiconductor chip 10 can be efficiently radiated from the metal plate 16 into the air or to the mother board 2 via the connectors 20.

Due to the above, the mounting method of the present embodiment has a high reliability due to the sealing by the resin and, in addition, has a low parasitic resistance, low parasitic capacitance, low parasitic inductance, etc. and has a small reduction of the operating performance due to heat generation, therefore is a mounting method suitable for high speed applications or high frequency applications.

Second Embodiment

The present embodiment shows a preferred mounting procedure for a case of use of the flip-chip method of a gold-gold contact for bonding the semiconductor chip and the mother board.

Figure 9:
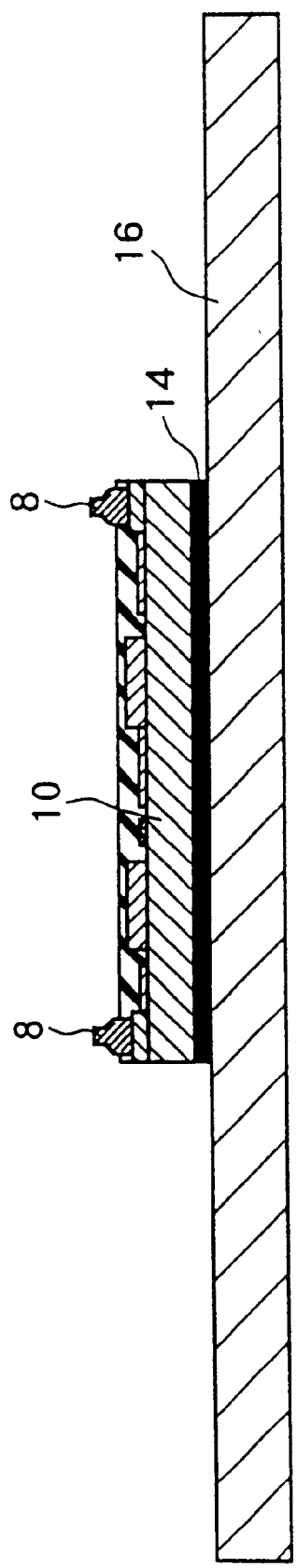
FIG. 9 is a sectional view of the process of mounting a semiconductor chip according to a second embodiment of the present invention and shows the time after die-bonding of the semiconductor chip to the conductive plate.
Figure 10:
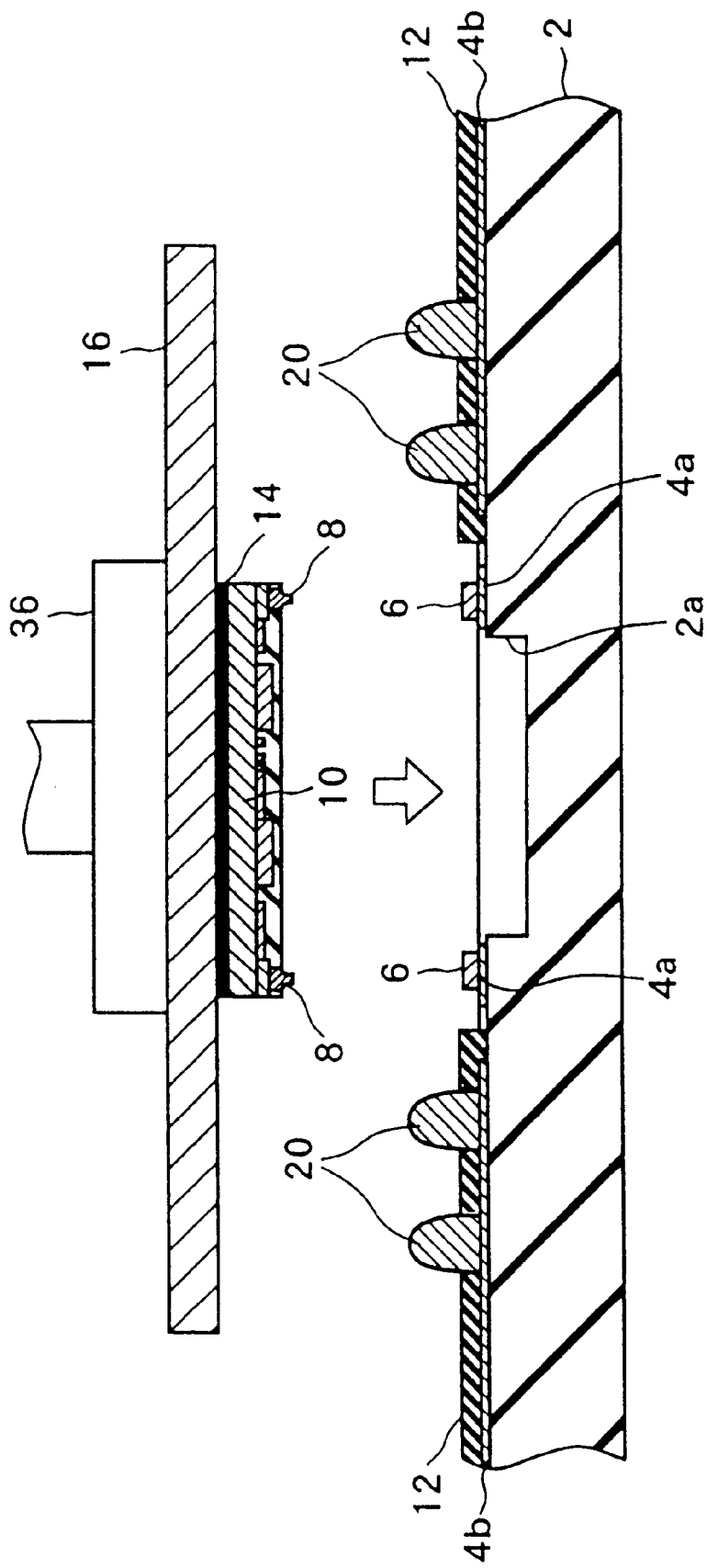
FIG. 10 is a sectional view of the process of mounting a semiconductor chip continuing from FIG. 9 and shows the time of mounting a conductive plate with a semiconductor chip.

FIG. 9 and FIG. 10 are sectional views of the main steps of the mounting method according to the present embodiment.

In the present embodiment, as shown in FIG. 9, a semiconductor chip 10 provided with gold bumps 8 is die-bonded to a predetermined position of the metal plate 16 with its element forming surface facing upward. At this time, as the conductive bonding layer 14, a silver paste, solder, or the like is used.

As shown in FIG. 10, gold pellets are supplied as the conductive layer 6 onto the predetermined interconnection patterns 4a of the mother board 2. Further, solder or other connectors 20 are supplied to the predetermined openings in the solder resist 12 of the mother board 2 by printing or potting.

The metal plate 16 to which the semiconductor chip 10 is die bonded is held by the mounting tool 36 with the element forming surface of the semiconductor chip 10 facing downward, positioned so that the gold bumps 8 come above the gold pellets, and mounted on the mother board 2. At this time, the semiconductor chip 10 is heated at for example 240° C. to 280° C. for several seconds and pressed. The pressure is applied even after the end of the heating for several seconds and the assembly allowed to cool as it is.

Thereafter, the same procedure is followed as in the first embodiment to supply the resin 18 and complete the mounting.

Third Embodiment

The present embodiment shows another method of the supply of the resin and formation of the connectors.

Figure 11:
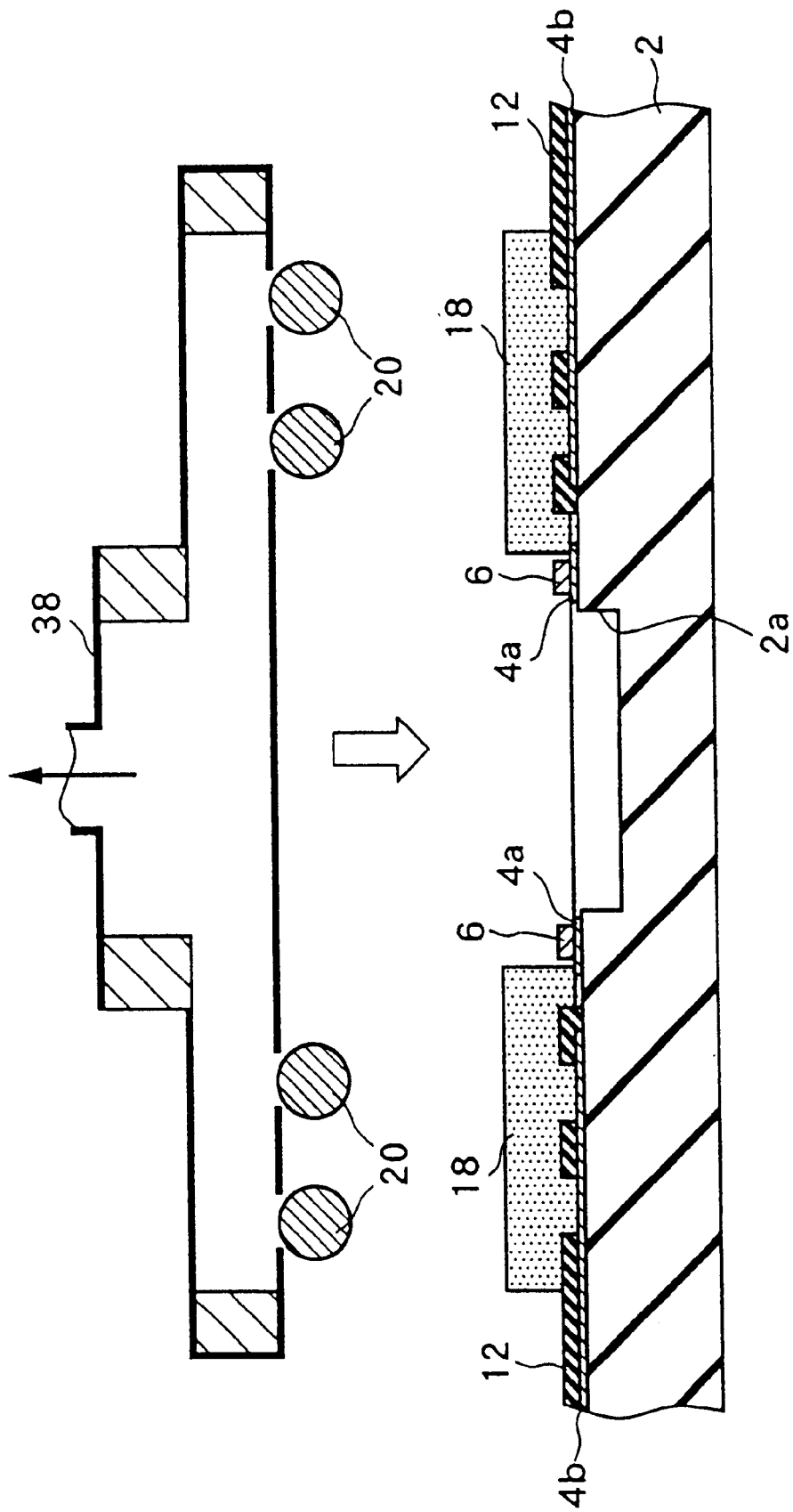
FIG. 11 is a sectional view of the process of mounting a semiconductor chip according to a third embodiment of the present invention and shows the time of mounting ball-shaped connectors.
Figure 12:
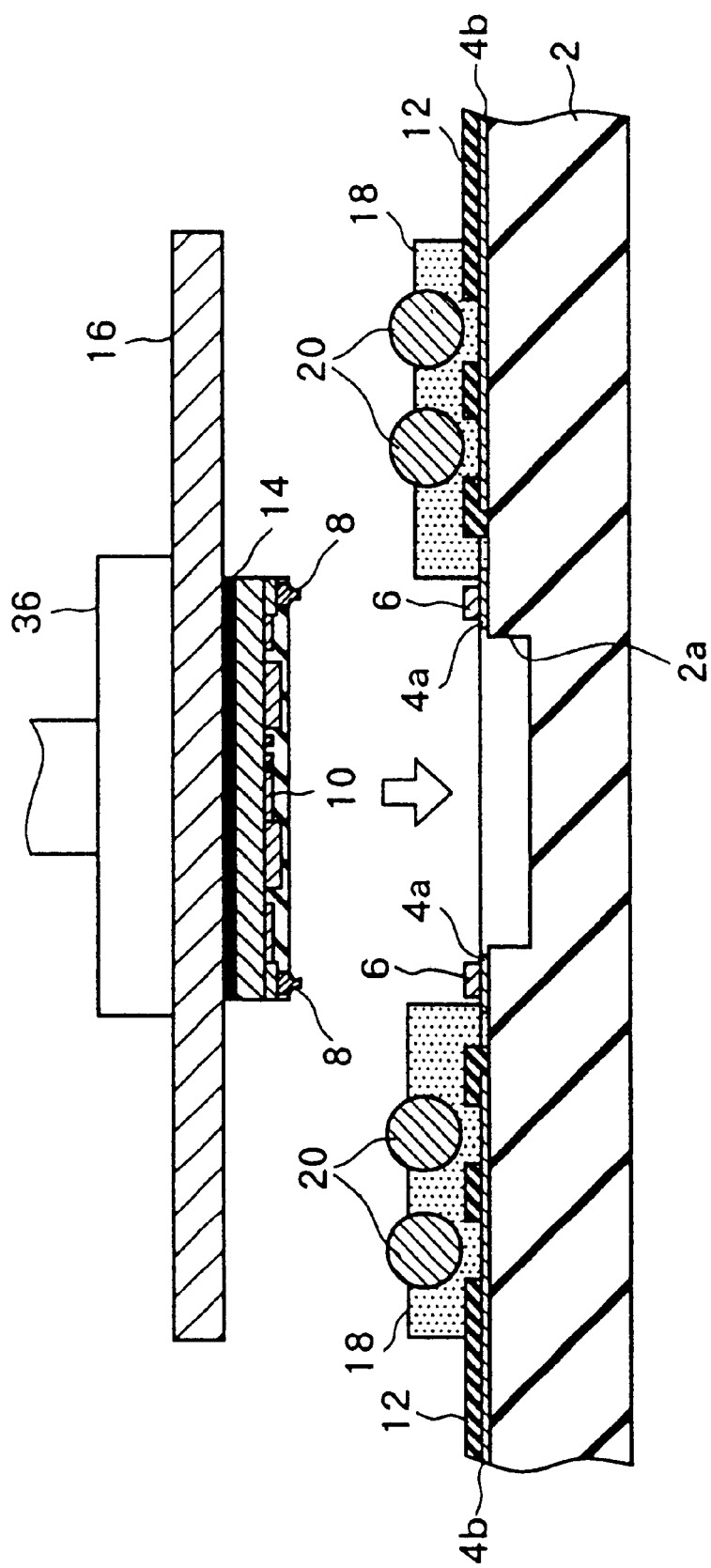
FIG. 12 is a sectional view of the process of mounting a semiconductor chip continuing from FIG. 11 and shows the time of mounting the conductive plate with a semiconductor chip.
Figure 13:
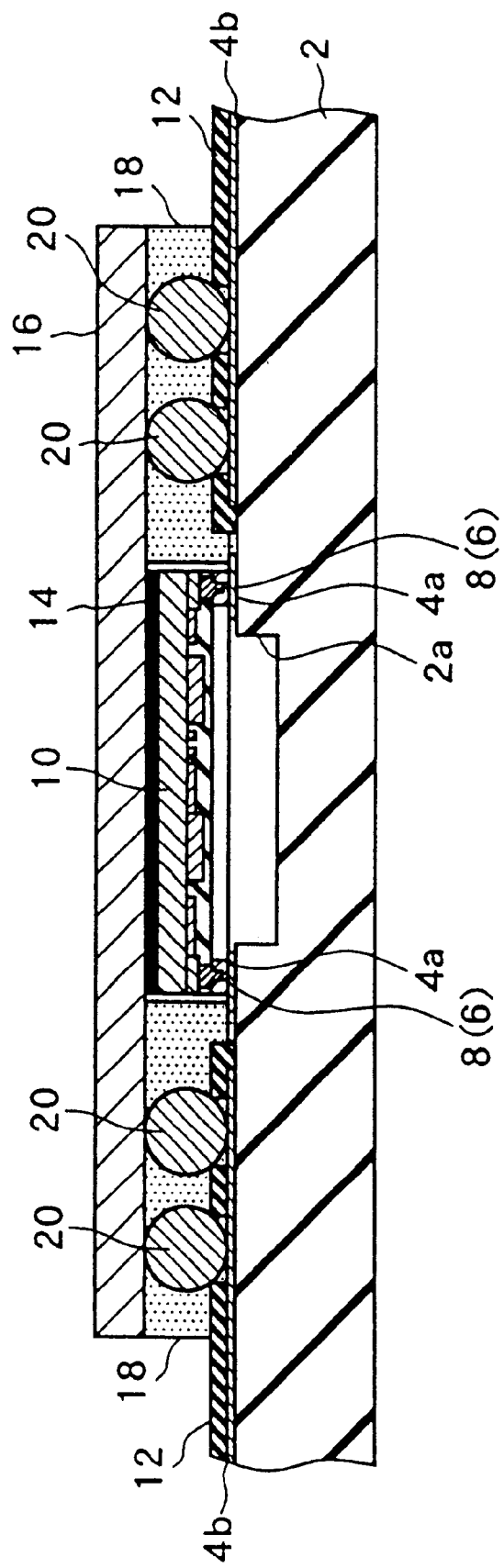
FIG. 13 is a sectional view of the state after completion of mounting of the semiconductor chip continuing from FIG. 12.

FIG. 11 to FIG. 13 are sectional views of principal steps of the mounting method according to the present embodiment.

In the same way as the second embodiment, a metal plate 16 (FIG. 9) to which the semiconductor chip 10 is die bonded is prepared. Further, as shown in FIG. 11, gold pellets are supplied as the conductive layer 6 onto the predetermined Interconnection patterns 4a of the mother board 2.

In the present embodiment, next a paste-like or gel-like resin 18 is supplied to predetermined positions on the mother board 2 by printing or potting.

Further, metal balls or plastic balls coated on the surface by a metal are supplied as the connectors 20 onto the resin 18 by using a special tool 38 able to pick them up by suction from the inside. This special tool 38 is provided with holes for holding connectors 20 matching the positions of supply of the connector 20. The ball-shaped connectors 20 can be transferred to above the resin 18 while holding them by suction from the holding holes, then placed on the resin 18 by stopping the suction.

As shown in FIG. 12, the metal plate 16 to which the semiconductor chip 10 is die bonded is held by the mounting tool 36 with the element forming surface of the semiconductor chip 10 facing downward, is positioned so that the gold bumps 8 come above the gold pellets, then is mounted on the mother board 2. At this time, the semiconductor chip 10 is heated at for example 160° C. to 240° C. for several seconds and pressed. The pressure is applied even after the end of the several seconds of heating and then the device is allowed to cool as it is.

By this, as shown in FIG. 13, the gold bumps 8 and the gold pellets are thermocompression bonded so as to electrically connect the semiconductor chip 10 and the interconnection patterns 4a and the connectors 20 are embedded in the resin 18 and the metal plate 16 and the interconnection patterns 4b are electrically and mechanically connected by the connectors 20.

Note that, in the example, a paste-like or gel-like resin 18 was printed or potted at the predetermined positions of the mother board 2, but it is also possible to supply the resin by adhering a resin tape 18 to the predetermined positions of the mother board 2.

Further, the resin can be a so-called anisotropic conductive resin containing dispersed therein gold, nickel, copper, or other metal conductive particles. The anisotropic conductive resin exhibits conductivity upon application of pressure. Thereafter, when supplying the connectors 20 and embedding the connectors 20 in the resin 18 by the pressing of the metal plate 16, even if the connectors 20 do not completely contact the interconnection patterns 4b, the electrical conductivity is achieved via the pressed resin part. For this reason, if an anisotropic conductive resin is used, the metal plate 16 and the interconnection patterns 4b can be reliably connected electrically via the connectors 20.

In the mounting method of the present embodiment, there is the advantage that resin 18 cures and shrinks to reliably achieve the connection of the gold bumps 8 provided on the semiconductor chip 10 and the interconnection patterns 4a on the mother board 2 or the metal plate 16 and the interconnection patterns 4b on the mother board.

The supply step of the resin 18 and the connector 20 and the die bonding step of the semiconductor chip can be carried out in parallel. Thereafter, it is sufficient to just superpose the mother board 2 and the metal plate 16 to which the semiconductor chip 10 is die bonded, therefore the mounting process is easy and the costs can be lowered.

There is no danger of the resin penetrating to the element forming surface of the semiconductor chip 10 as in the case of injecting the resin later and therefore the prevention of the reduction of the characteristics is easy.

Since no material containing lead is used as the solder, a safe and clean mounting process can be constructed and there is no apprehension of environmental pollution after disposal either.

Due to the above, the mounting method according to the present embodiment is excellent in view of cost, characteristics, safety, and the environment.

Fourth Embodiment

The present embodiment shows the case where the mounting methods of first to third embodiments are applied to a method for production of a semiconductor device.

Concretely, all of the mounting methods and all of the modifications in the first to third embodiments are possible using a package board provided with external terminations in place of the mother board 2 of the first to third embodiments.

Accordingly, the principal mounting steps overlap those in the above explanation, therefore, here, the explanation will be made of an example of the structure of a semiconductor device according to the present invention referring to the drawings. Note that the overlapping parts of the structure are indicated by the same reference numerals and explanations thereof will be omitted.

Figure 14:
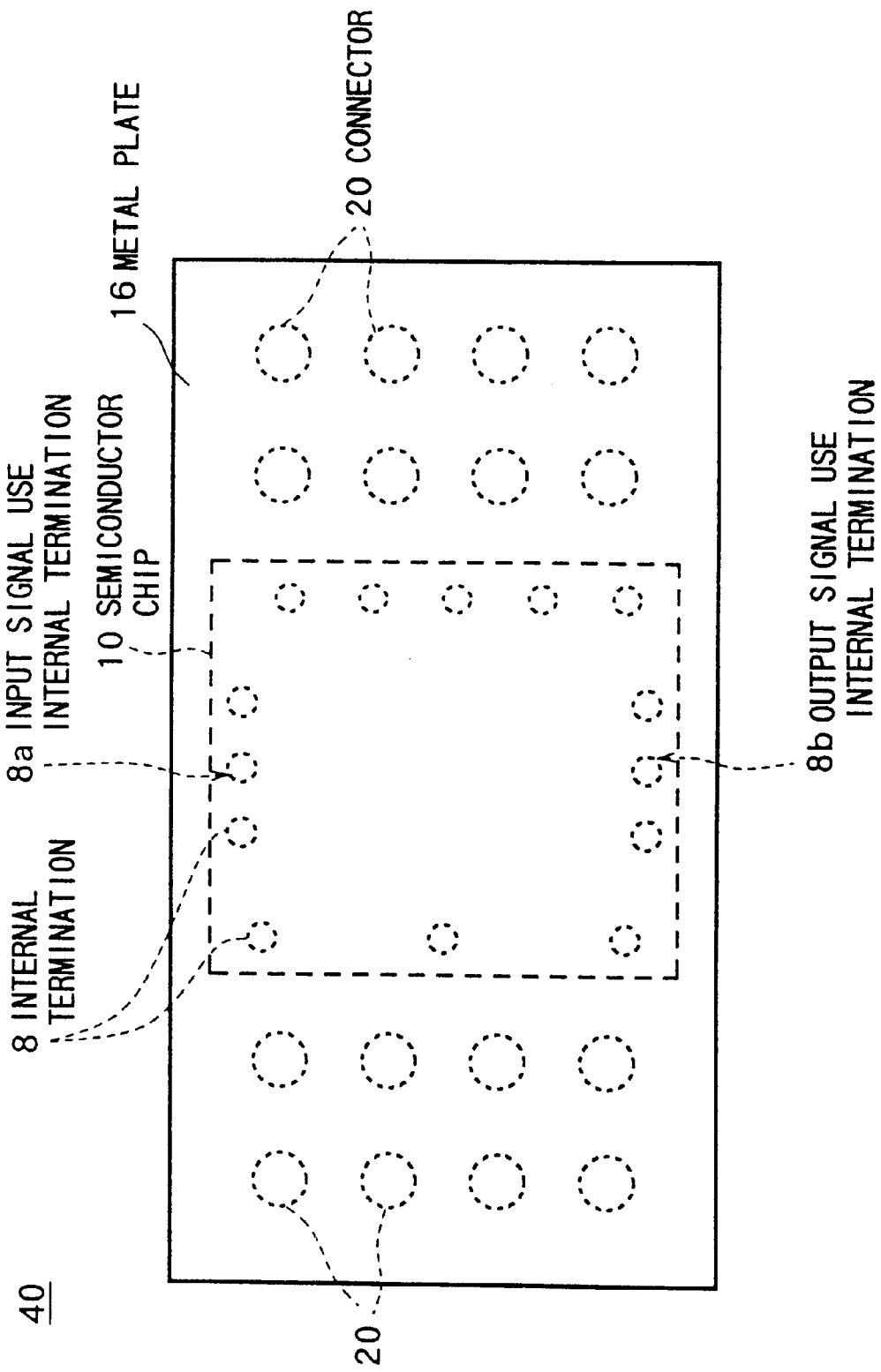
FIG. 14 is a top view of a semiconductor device according to a fourth embodiment of the present invention.
Figure 15:
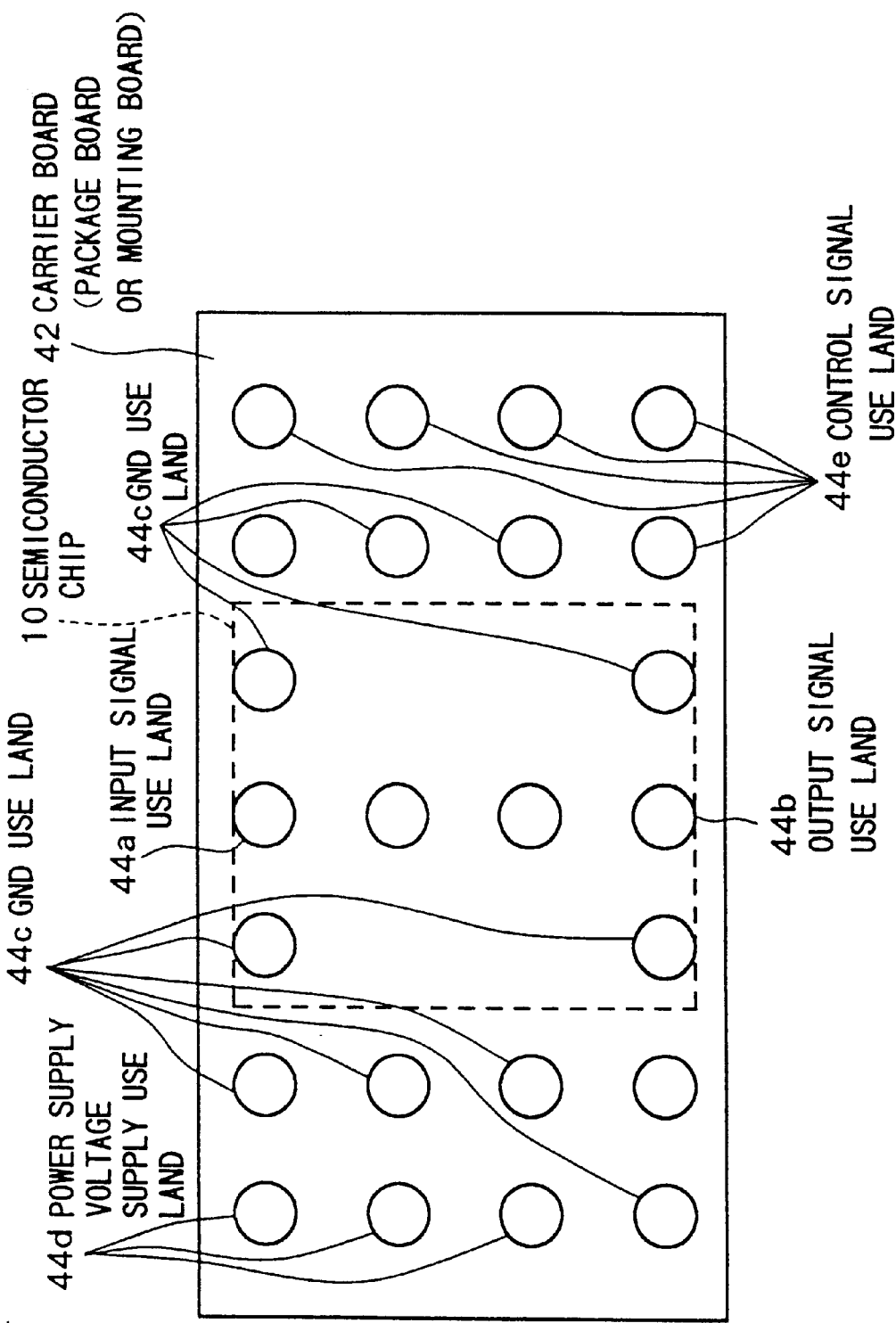
FIG. 15 is a bottom view of a semiconductor device.

FIG. 14 is a top view of a semiconductor device according to the present embodiment, and FIG. 15 is a bottom view. Further, FIG. 16 is a sectional view of a long direction of the related semiconductor device, and FIG. 17 is a sectional view of a short direction.

Figure 16:
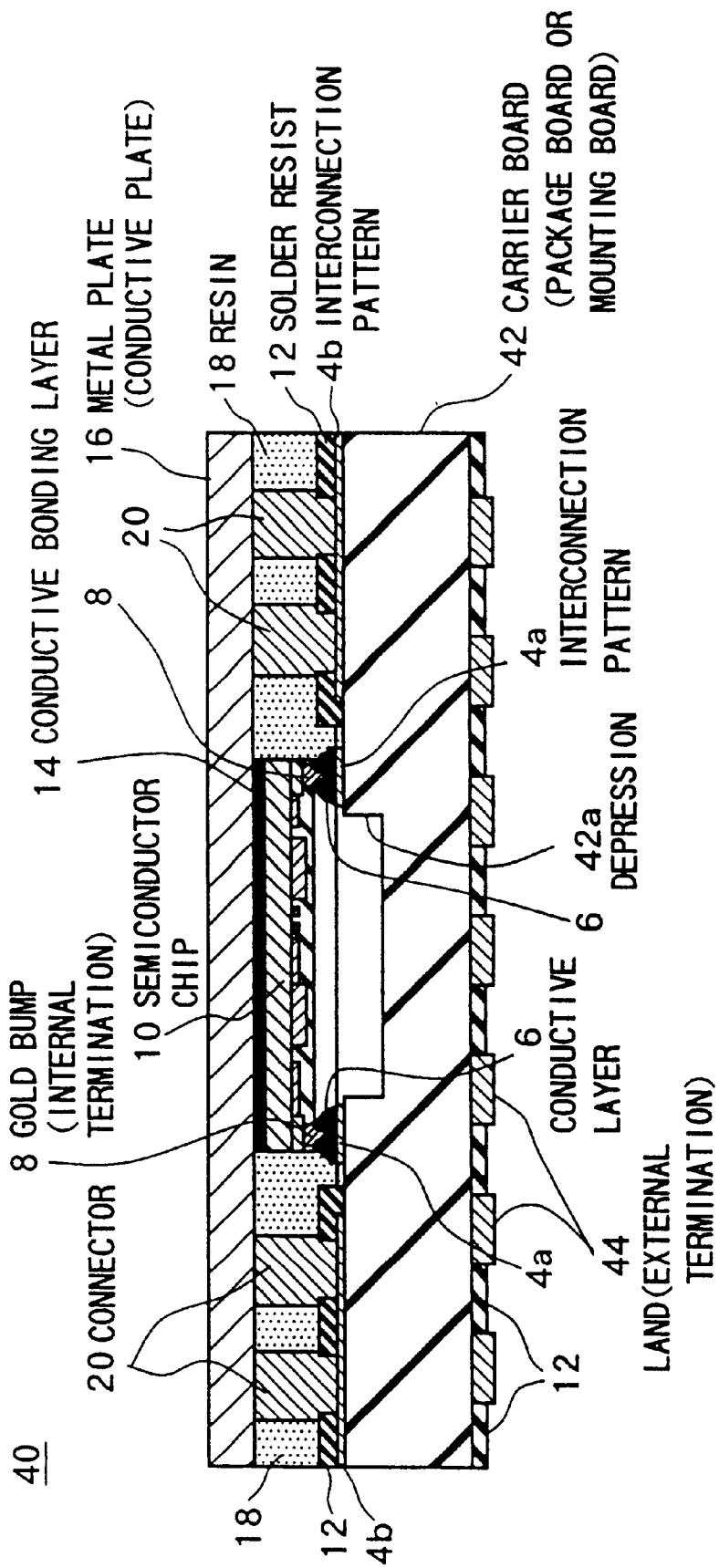
FIG. 16 is a sectional view of a long direction of the semiconductor device.
Figure 17:
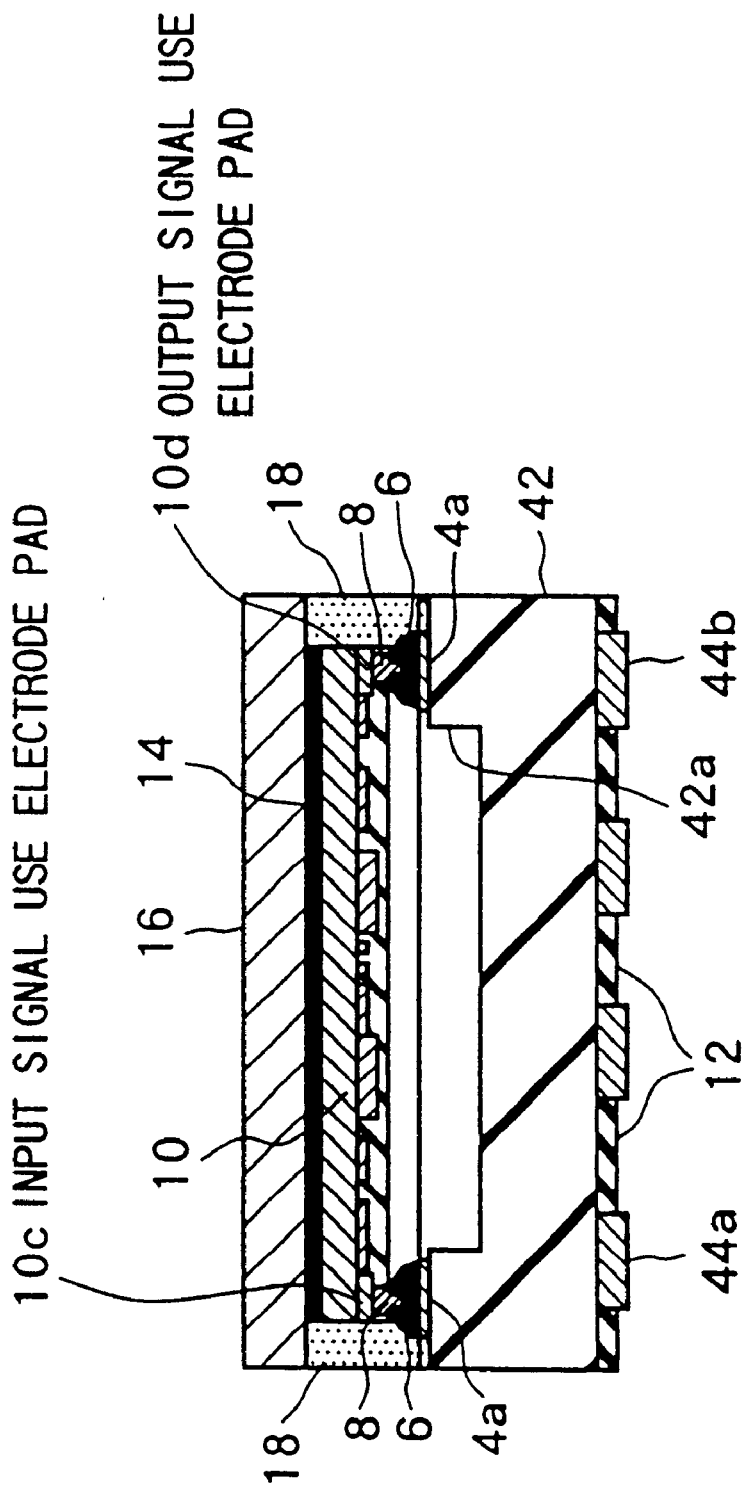
FIG. 17 is a sectional view of a short direction of the semiconductor device.
Figure 18:
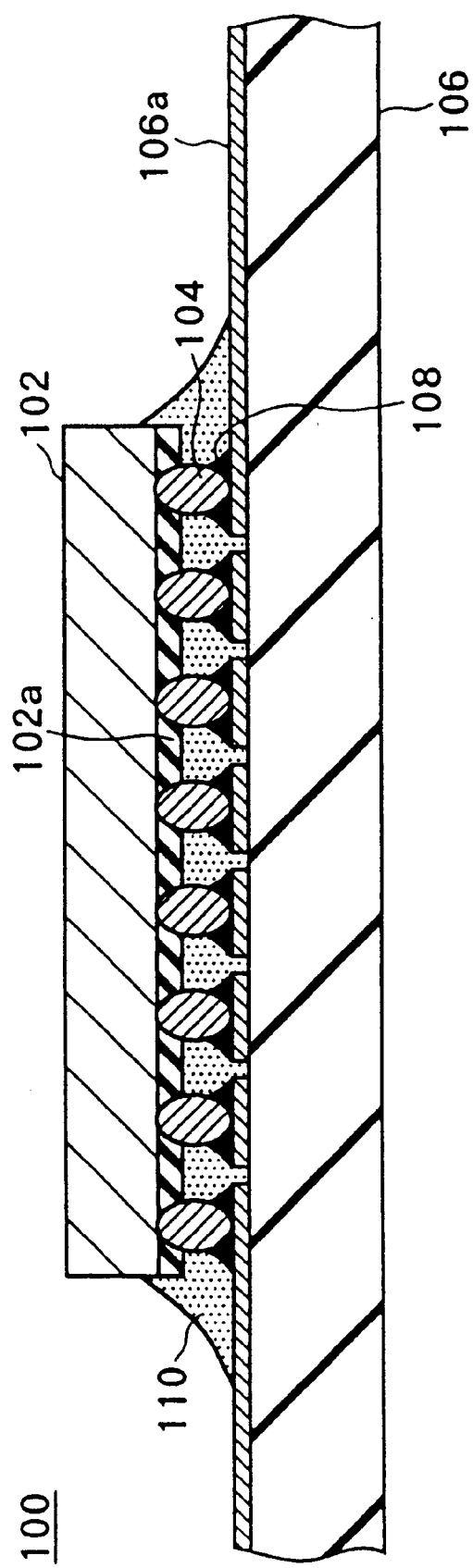
FIG. 18 is a sectional view of an example of the structure by flip-chip mounting of a semiconductor chip of the related art.

In the semiconductor device 40, as shown in FIG. 16 and FIG. 17, the semiconductor chip 10 is mounted on a package use carrier board 42 by the flip-chip method with its element forming surface facing a depression 42a of the carrier board 42.

Lands 44 (external terminations) for bonding to the mother board are arranged on the bottom surface of the carrier board 42. The lands 44 are connected to the corresponding interconnection patterns 4a or 4b by not shown internal interconnections.

The electrode pads to which a signal amplification circuit, bias circuit, and the like in the semiconductor chip 10 are connected are connected to the interconnection patterns 4a on the carrier board 42 via the flip-chip portions, that is, the gold bumps 8 on the electrode pads or the conductive layer 6. On the other hand, the back surface of the semiconductor chip 10 is electrically connected to the interconnection patterns 4b on the carrier board 42 by the metal plate 16 and the connectors 20.

In this way, the electrical connection with the corresponding bonding lands 44 is achieved for the electrode pads and back surface of the semiconductor chip 10 via the interconnection patterns 4a or 4b and the interconnections inside the carrier board.

Lands 44 are arranged in the form of an array on the bottom surface of the carrier board 42 to form a surface mounting package structure of a so-called ball grid array or land grid array type. Note that, in the case of the ball grid array, balls made of copper or the like are thermocompression bonded to the lands 44. External terminations are achieved by the balls and lands 44.

Such a surface mounting package structure is effective for lowering the heat resistance when mounting a device on a mother board.

Note that in a usual high frequency use IC, as shown in FIG. 2, ordinarily an input portion is provided on one of two facing sides along the flow of signals, and an output portion is provided on the other. At this time, the electrode pad for supply of the power supply voltage and electrode pad for the control signals for a bias circuit are allocated to the remaining two sides.

In general, in a high frequency circuit, a leakage of the high frequency electric power to the bias system, control system, and power supply system becomes the cause of deterioration of the performance, therefore, even after the mounting, it becomes important to avoid interference between terminals of these systems. Further, when drawing out the input and output of the high frequency signal to the outside of the package, desirably the signal loss is minimized. For this reason, it is necessary to make the wiring distance between the electrode pads for the input signal or for output signal and the external terminations as short as possible.

In the example of the arrangement of lands of FIG. 15, an arrangement of lands corresponding to the semiconductor chip structure shown in FIG. 2 and FIG. 3 is exhibited.

Namely, as clarified in FIG. 17, a land 44a for an input signal is arranged beneath the input signal use electrode pad 10c, and a land 44b for an output signal is arranged beneath the output signal use electrode pad 10d. These input signal use and output signal use lands 44a and 44b are arranged at substantially center positions along the long sides of the carrier board 42 as shown in FIG. 15.

Further, corresponding to the fact that pads 10e for the supply of the common potential are arranged at the two sides of the input signal use or output signal use electrode pads on the chip (FIG. 2), in the example of the land arrangement of FIG. 15, lands 44c for common potential, for example, the ground potential GND, are arranged at the two sides of the input signal use land 44a or the output signal use land 44b.

Then, the remaining GND use lands 44c, power supply voltage supply lands 44d, and control signal use lands 44e are mainly allocated to and arranged at the two sides of the semiconductor chip 10 near the short sides of the carrier board 42 so that they are grouped by type.

The semiconductor device 40 according to the present embodiment is improved in the high frequency characteristic by arranging the input signal use land 44a or output signal use land 44b so that the wiring length from the chip becomes as short as possible. Further, by arranging other GND use lands 44c, power supply voltage supply lands 44d, and control signal use lands 44e so that they are grouped by type, interference among systems is prevented and therefore reduction of the high frequency characteristics due to interference among systems is effectively prevented.

In the same way as the first to third embodiments, by providing the depression 42a in the carrier board 42, a reduction of the high frequency characteristics is prevented. Further, due to the heat radiating effect of the metal plate 16, the characteristics and the reliability are not impaired even with a large output high frequency circuit. Further, due to the reliable connection of the metal plate to the reference potential (for example, ground potential), a stable operation can be guaranteed without degradation of the high frequency characteristics. In addition, the grounded metal plate 16 acts to prevent the leakage of the high frequency power to the bias system, control system, and power supply system, that is, electromagnetic interference, due to its dumping effect.

In the same way as with the first to third embodiments, further, the hermeticity of the semiconductor chip 10 is held by a simple, low cost structure using the resin 18 arranged on its periphery and thus an improvement of the reliability is achieved. Further, the resin 18 disperses and relieves the thermal and mechanical stress applied to the flip-chip connection portion, protects the connection portion from a fatigue breakage, and contributes to prolongation of the device lifetime. Further, it is not necessary to perform the sealing step while carefully ensuring the hermeticity as in the related art, a step for checking for leakage or a sealing cap material become unnecessary, and therefore the costs can be reduced by that amount.

Due to the above, it becomes possible to realize a highly integrated, highly reliable, low cost small size semiconductor device while making good use of the excellent points of flip-chip connection of preventing the reduction of the high speed characteristic and high frequency characteristics of the device as much as possible and further without degradation of the design characteristics of the passive elements.

Summarizing the effects of the present invention, according to the semiconductor device and method of production thereof and the method of mounting a component according to the present invention, it is possible to achieve a semiconductor chip or other component which has small parasitic inductance or the like even when using flip-chip mounting, can easily dissipate heat and be grounded, has excellent characteristics and reliability, and is low in cost.

While the invention has been described by reference to specific embodiments chosen for purposes of illustration, it should be apparent that numerous modifications could be made thereto by those skilled in the art without departing from the basic concept and scope of the invention.

What is claimed is:

1. A semiconductor device comprising:

a package board having interconnections patterns on one main surface;

a semiconductor chip electrically connected through internal terminations to the interconnection patterns of the package board and having an element forming surface facing said package board across a space; and a conductive plate connected to a back surface of the semiconductor chip of a side opposite to the element forming surface through a conductive bonding layer, the semiconductor chip being sealed in a resin formed in a circumferential direction in a gap between the package board and the conductive plate wherein the resin is in contact with a side surface of the semiconductor chip and the element forming surface is free of contact with any of the resin.

2. A semiconductor device as set forth in claim 1, wherein the one main surface of the package board is provided with a depression enlarging the space in the thickness direction of the package board.

3. A semiconductor device as set forth in claim 1, further comprising:

external terminations formed on the other main surface of the package board and electrically connected to corresponding interconnection patterns; and connectors formed in the resin and electrically connecting said conductive plate to the interconnection patterns electrically connected to external terminations for supply of a reference potential.

4. A semiconductor device as set forth in claim 1, wherein:

the other main surface of said package board is formed with external terminations electrically connected to corresponding interconnection patterns, the element forming surface of the semiconductor chip is formed with a circuit, and the external terminations for an input signal or an output signal are arranged below electrode pads for an input signal or output signal of said circuit.

5. A semiconductor device as set forth in claim 3, wherein:

the element forming surface of said semiconductor chip is formed with a circuit, electrode pads for an input signal or an output signal of said circuit are provided at opposite two sides among the four sides of the semiconductor chip, and said connectors are arranged at the outside of the other two sides of the semiconductor chip.

6. A semiconductor device as set forth in claim 1, wherein said resin is comprised of an epoxy-based resin, an acryl-based resin, or an acid anhydride-based resin along or in mixtures of two or more types, is formed into a gel or paste by addition of a curing agent, and is shrunken by a heat reaction.

* * * * *